US011682330B2

(12) United States Patent
Tao

(10) Patent No.: US 11,682,330 B2
(45) Date of Patent: Jun. 20, 2023

(54) GOA CIRCUIT AND DISPLAY PANEL

(71) Applicant: WUHAN CHINA STAR OPTOELECTRONICS TECHNOLOGY CO., LTD, Wuhan (CN)

(72) Inventor: Jian Tao, Wuhan (CN)

(*) Notice: Subject to any disclaimer, the term of this patent is extended or adjusted under 35 U.S.C. 154(b) by 507 days.

(21) Appl. No.: 16/970,649

(22) PCT Filed: Jun. 24, 2020

(86) PCT No.: PCT/CN2020/097877
§ 371 (c)(1),
(2) Date: Aug. 18, 2020

(87) PCT Pub. No.: WO2021/237847
PCT Pub. Date: Dec. 2, 2021

(65) Prior Publication Data
US 2023/0134368 A1 May 4, 2023

(30) Foreign Application Priority Data
May 25, 2020 (CN) .......................... 202010449696.1

(51) Int. Cl.
*G09G 3/20* (2006.01)
(52) U.S. Cl.
CPC ....... *G09G 3/20* (2013.01); *G09G 2300/0408* (2013.01); *G09G 2310/08* (2013.01)

(58) Field of Classification Search
CPC ......... G09G 2300/0408; G09G 3/3677; G09G 2310/0286
See application file for complete search history.

(56) References Cited

U.S. PATENT DOCUMENTS

| 11,551,604 | B2* | 1/2023 | Kim | G09G 3/3677 |
| 2011/0150169 | A1 | 6/2011 | Lin et al. | |
| 2016/0247822 | A1* | 8/2016 | Chen | G09G 3/3688 |
| 2020/0020264 | A1* | 1/2020 | Chen | G09G 3/3266 |
| 2020/0105202 | A1* | 4/2020 | Yuan | G09G 3/3258 |
| 2020/0273419 | A1* | 8/2020 | Wang | G09G 3/3677 |
| 2021/0049971 | A1* | 2/2021 | Xiao | G06F 3/0412 |
| 2022/0114967 | A1* | 4/2022 | Xue | G09G 3/3266 |
| 2023/0035132 | A1* | 2/2023 | Kang | G09G 3/3688 |

FOREIGN PATENT DOCUMENTS

| CN | 104282270 A | 1/2015 |
| CN | 106157923 A | 11/2016 |
| CN | 108735141 A | 11/2018 |
| CN | 109036303 A | 12/2018 |
| CN | 110782855 A | 2/2020 |
| CN | 111081183 A | 4/2020 |

* cited by examiner

*Primary Examiner* — Van N Chow

(57) ABSTRACT

In a GOA circuit and a display panel provided by embodiments of the present application, a reset module is provided in each level of GOA units, so that each level of the GOA units can output a high potential before an end of a frame, all gates in a display area are turned on, and a charge of all pixels in the display area is discharged; after that, each level of the GOA units outputs a low potential, and all of the gates in the display area are set to the low potential.

20 Claims, 4 Drawing Sheets

GOA CIRCUIT AND DISPLAY PANEL

BACKGROUND OF INVENTION

Field of Invention

The present application relates to the field of display technology, in particular to a GOA circuit and a display panel.

Description of Prior Art

Gate driver on array, referred to as GOA, is a technology that uses an existing thin film transistor liquid crystal display array manufacturing process to fabricate a line scan drive signal circuit on an array substrate to realize a driving method of a plurality of scanning lines progressively.

As resolutions of display panels become higher and higher, a number of scanning lines is also increasing, and a probability of level transmission errors increases. At the same time, abnormal power failure may occur during customer operation. If there is no power-off scan and reset function, it will often cause residual charge and cause abnormal display. Therefore, a GOA circuit of a high-resolution display panel has poor level transfer stability.

SUMMARY OF INVENTION

The purpose of an embodiment of the present application is to provide a GOA circuit and a display panel, which can solve the technical problem of poor level transfer stability of a GOA circuit of an existing high-resolution display panel.

In a first aspect, the embodiment of the present application provides a gate driver on array (GOA) circuit, comprising multi-level cascaded GOA units, wherein each level of the GOA units comprises a pull-up control module, a pull-up module, a pull-down module, a pull-down holding module, and a reset module;

wherein the pull-up control module is connected to an upper-level scan signal, a first scan control signal, and a low-level signal, and is electrically connected to a first node; and the pull-up control module is configured to output the first scan control signal to the first node according to the upper-level scan signal, the low-level signal, and the first scan control signal;

wherein the pull-up module is connected to a high-level signal and a clock signal of a current level, and is electrically connected to a scan signal output end of the current level and the first node; and the pull-up module is configured to output a scan signal of the current level at the scan signal output end according to the high level signal, the clock signal of the current level and a potential of the first node;

wherein the pull-down module is connected to a next-level clock signal, an upper-level clock signal, a second scan control signal, a next-level scan signal, the low-level signal, and the high-level signal, and is electrically connected to the first node and a second node; and the pull-down module is configured to pull down the potential of the first node and pull up a potential of the second node according to the next-level clock signal, the upper-level clock signal, the second scan control signal, the next-level scan signal, the low-level signal and the high-level signal;

wherein the pull-down holding module is connected to a pull-down holding control signal and the low-level signal, and is electrically connected to the first node, the second node and the scan signal output end of the current level; and the pull-down holding module is configured to hold the potential of the first node and a potential of the scan signal output end of the current level according to the pull-down holding control signal, the low-level signal and the potential of the second node;

wherein the reset module is connected to a first function control signal, a second function control signal and the high-level signal, and is electrically connected to the scan signal output end of the current level; and the reset module is configured to reset the potential of the scan signal output end according to the first function control signal, the second function control signal, and the high level signal;

wherein the reset module comprises a twelfth transistor and a thirteenth transistor;

a gate of the twelfth transistor is electrically connected to a fourth node, a source of the twelfth transistor is electrically connected to the first function control signal, and a drain of the twelfth transistor is electrically connected to the scan signal output end of the current level;

a gate of the thirteenth transistor is electrically connected to the high-level signal, a source of the thirteenth transistor is electrically connected to the second function control signal, and a drain of the thirteenth transistor is electrically connected to the fourth node; and the pull-down holding control signal is the same signal as the first function control signal or the second function control signal.

In the GOA circuit described in the embodiment of the present application, the pull-up control module comprises a third transistor and a first capacitor;

a gate of the third transistor is electrically connected to the upper-level scan signal, a source of the third transistor is electrically connected to the first scan control signal, and a drain of the third transistor is electrically connected to the first node; and one end of the first capacitor is electrically connected to the first node, and another end of the first capacitor is electrically connected to the low-level signal.

In the GOA circuit described in the embodiment of the present application, the pull-up module comprises a sixth transistor and an eighth transistor;

a gate of the sixth transistor is electrically connected to the high-level signal, a source of the sixth transistor is electrically connected to the first node, and a drain of the sixth transistor is electrically connected to a third node;

a gate of the eighth transistor is electrically connected to the third node, a source of the eighth transistor is electrically connected to the clock signal of the current level, and a drain of the eighth transistor is electrically connected to the scan signal output end of the current level.

In the GOA circuit described in the embodiment of the present application, when the eighth transistor is turned on, a potential of the third node is greater than the potential of the first node.

In the GOA circuit described in the embodiment of the present application, the pull-down module comprises a first transistor, a second transistor, a fourth transistor, a fifth transistor, and a ninth transistor;

a gate of the first transistor is electrically connected to the first scan control signal, and a source of the first transistor is electrically connected to the next-level clock signal;

a gate of the second transistor is electrically connected to the second scan control signal, and a source of the second transistor is electrically connected to the upper-level clock signal;

a drain of the first transistor, a drain of the second transistor and a gate of the fifth transistor are electrically connected, a source of the fifth transistor is electrically connected to the high-level signal, and a drain of the fifth transistor is electrically connected to the second node;

a gate of the fourth transistor is electrically connected to the next-level scan signal, a source of the fourth transistor is electrically connected to the second scan control signal, and a drain of the fourth transistor is electrically connected to the first node;

a gate of the ninth transistor is electrically connected to the first node, a source of the ninth transistor is electrically connected to the low-level signal, and a drain of the ninth transistor is electrically connected to the second node.

In the GOA circuit described in the embodiment of the present application, the pull-down holding module comprises a seventh transistor, a tenth transistor, an eleventh transistor, and a second capacitor;

a gate of the seventh transistor is electrically connected to the second node, a source of the seventh transistor is electrically connected to the low-level signal, and a drain of the seventh transistor is electrically connected to the first node; and a gate of the tenth transistor is electrically connected to the first function control signal or the second function control signal, a source of the tenth transistor is electrically connected to the low-level signal, and a drain of the tenth transistor is electrically connected to the second node; and a gate of the eleventh transistor is electrically connected to the second node, a source of the tenth transistor is electrically connected to the low-level signal, and a drain of the tenth transistor is electrically connected to the scan signal output end of the current level.

In the GOA circuit described in the embodiment of the present application, when the twelfth transistor is turned on, a potential of the fourth node is greater than a potential of the second function control signal.

In a second aspect, the embodiment of the present application provides a gate driver on array (GOA) circuit, comprising multi-level cascaded GOA units, wherein each level of the GOA units comprises a pull-up control module, a pull-up module, a pull-down module, a pull-down holding module, and a reset module;

wherein the pull-up control module is connected to an upper-level scan signal, a first scan control signal, and a low-level signal, and is electrically connected to a first node; the pull-up control module is configured to output the first scan control signal to the first node according to the upper-level scan signal, the low-level signal, and the first scan control signal;

wherein the pull-up module is connected to a high-level signal and a clock signal of a current level, and is electrically connected to a scan signal output end of the current level and the first node; and the pull-up module is configured to output a scan signal of the current level at the scan signal output end according to the high level signal, the clock signal of the current level and a potential of the first node;

wherein the pull-down module is connected to a next-level clock signal, an upper-level clock signal, a second scan control signal, a next-level scan signal, the low-level signal and the high-level signal, and is electrically connected to the first node and a second node; and the pull-down module is configured to pull down the potential of the first node and pull up a potential of the second node according to the next-level clock signal, the upper-level clock signal, the second scan control signal, the next-level scan signal, the low-level signal and the high-level signal;

wherein the pull-down holding module is connected to a pull-down holding control signal and the low-level signal, and is electrically connected to the first node, the second node and the scan signal output end of the current level; and the pull-down holding module is configured to hold a potential of the first node and the potential of the scan signal output end of the current level according to the pull-down holding control signal, the low-level signal and the potential of the second node; and wherein the reset module is connected to a first function control signal, a second function control signal and the high-level signal, and is electrically connected to the scan signal output end of the current level; and the reset module is configured to reset the potential of the scan signal output end according to the first function control signal, the second function control signal, and the high level signal.

In the GOA circuit described in the embodiment of the present application, the pull-up control module comprises a third transistor and a first capacitor;

a gate of the third transistor is electrically connected to the upper-level scan signal, a source of the third transistor is electrically connected to the first scan control signal, and a drain of the third transistor is electrically connected to the first node; and one end of the first capacitor is electrically connected to the first node, and another end of the first capacitor is electrically connected to the low-level signal.

In the GOA circuit described in the embodiment of the present application, the pull-up module comprises a sixth transistor and an eighth transistor;

a gate of the sixth transistor is electrically connected to the high-level signal, a source of the sixth transistor is electrically connected to the first node, and a drain of the sixth transistor is electrically connected to a third node;

a gate of the eighth transistor is electrically connected to the third node, a source of the eighth transistor is electrically connected to the clock signal of the current level, and a drain of the eighth transistor is electrically connected to the scan signal output end of the current level.

In the GOA circuit described in the embodiment of the present application, when the eighth transistor is turned on, a potential of the third node is greater than the potential of the first node.

In the GOA circuit described in the embodiment of the present application, the pull-down module comprises a first transistor, a second transistor, a fourth transistor, a fifth transistor, and a ninth transistor;

a gate of the first transistor is electrically connected to the first scan control signal, and a source of the first transistor is electrically connected to the next-level clock signal;

a gate of the second transistor is electrically connected to the second scan control signal, and a source of the second transistor is electrically connected to the upper-level clock signal;

a drain of the first transistor, a drain of the second transistor and a gate of the fifth transistor are electrically connected, a source of the fifth transistor is electrically connected to the high-level signal, and a drain of the fifth transistor is electrically connected to the second node;

a gate of the fourth transistor is electrically connected to the next-level scan signal, a source of the fourth transistor is electrically connected to the second scan control signal, and a drain of the fourth transistor is electrically connected to the first node; and a gate of the ninth transistor is electrically connected to the first node, a source of the ninth transistor is electrically connected to the low-level signal, and a drain of the ninth transistor is electrically connected to the second node.

In the GOA circuit described in the embodiment of the present application, the pull-down holding module comprises a seventh transistor, a tenth transistor, an eleventh transistor, and a second capacitor;

a gate of the seventh transistor is electrically connected to the second node, a source of the seventh transistor is electrically connected to the low-level signal, and a drain of the seventh transistor is electrically connected to the first node;

a gate of the tenth transistor is electrically connected to the first function control signal or the second function control signal, a source of the tenth transistor is electrically connected to the low-level signal, and a drain of the tenth transistor is electrically connected to the second node; and a gate of the eleventh transistor is electrically connected to the second node, a source of the tenth transistor is electrically connected to the low-level signal, and a drain of the tenth transistor is electrically connected to the scan signal output end of the current level.

In the GOA circuit described in the embodiment of the present application, the reset module comprises a twelfth transistor and a thirteenth transistor;

a gate of the twelfth transistor is electrically connected to a fourth node, a source of the twelfth transistor is electrically connected to the first function control signal, and a drain of the twelfth transistor is electrically connected to the scan signal output end of the current level; and a gate of the thirteenth transistor is electrically connected to the high-level signal, a source of the thirteenth transistor is electrically connected to the second function control signal, and a drain of the thirteenth transistor is electrically connected to the fourth node.

In the GOA circuit described in the embodiment of the present application, when the twelfth transistor is turned on, a potential of the fourth node is greater than a potential of the second function control signal.

In the GOA circuit described in the embodiment of the present application, the pull-down holding control signal is the same signal as the first function control signal or the second function control signal.

In a third aspect, the embodiment of the present application also provides a display panel, comprising a gate driver on array (GOA) circuit, wherein the GOA circuit comprises multi-level cascaded GOA units, each level of the GOA units comprises a pull-up control module, a pull-up module, a pull-down module, a pull-down holding module, and a reset module;

the pull-up control module is connected to an upper-level scan signal, a first scan control signal, and a low-level signal, and is electrically connected to a first node; and the pull-up control module is configured to output the first scan control signal to the first node according to the upper-level scan signal, the low-level signal and the first scan control signal;

the pull-up module is connected to a high-level signal and a clock signal of a current level, and is electrically connected to a scan signal output end of the current level and the first node; and the pull-up module is configured to output a scan signal of the current level at the scan signal output end according to the high level signal, the clock signal of the current level and a potential of the first node;

the pull-down module is connected to a next-level clock signal, an upper-level clock signal, a second scan control signal, a next-level scan signal, the low-level signal and the high-level signal, and is electrically connected to the first node and a second node; and the pull-down module is configured to pull down the potential of the first node and pull up a potential of the second node according to the next-level clock signal, the upper-level clock signal, the second scan control signal, the next-level scan signal, the low-level signal and the high-level signal;

the pull-down holding module is connected to a pull-down holding control signal and the low-level signal, and is electrically connected to the first node, the second node and the scan signal output end of the current level; and the pull-down holding module is configured to hold the potential of the first node and a potential of the scan signal output end of the current level according to the pull-down holding control signal, the low-level signal and the potential of the second node; and the reset module is connected to a first function control signal, a second function control signal and the high-level signal, and is electrically connected to the scan signal output end of the current level; and the reset module is configured to reset the potential of the scan signal output end according to the first function control signal, the second function control signal, and the high level signal.

In the display panel described in the embodiment of the present application, the pull-up control module comprises a third transistor and a first capacitor;

a gate of the third transistor is electrically connected to the upper-level scan signal, a source of the third transistor is electrically connected to the first scan control signal, and a drain of the third transistor is electrically connected to the first node; and one end of the first capacitor is electrically connected to the first node, and another end of the first capacitor is electrically connected to the low-level signal.

In the display panel described in the embodiment of the present application, the pull-up module comprises a sixth transistor and an eighth transistor;

a gate of the sixth transistor is electrically connected to the high-level signal, a source of the sixth transistor is electrically connected to the first node, and a drain of the sixth transistor is electrically connected to a third node; and a gate of the eighth transistor is electrically connected to the third node, a source of the eighth transistor is electrically connected to the clock signal of the current level, and a drain of the eighth transistor is electrically connected to scan signal output end of the current level.

In the display panel described in the embodiment of the present application, when the eighth transistor is turned on, a potential of the third node is greater than the potential of the first node.

In the GOA circuit and display panel provided by the embodiment of the present application, a reset module is provided in each level of the GOA units, so that each level of the GOA units can output a high potential before the end of a frame, and all gates in the display area are turned on, the charge of all pixels in the display area is discharged; after that, each level of the GOA units outputs a low potential, and all gates in the display area are set to low potential; that is, the embodiment of the present application can improve the ability of abnormal power scanning and normal scanning; and can improve the stability of the GOA circuit of the high-resolution display panel.

BRIEF DESCRIPTION OF DRAWINGS

In order to more clearly explain the technical solutions in the embodiments of the present application, the following will briefly introduce the drawings required in the description of the embodiments. Obviously, the drawings in the following description are only some embodiments of the present application. For those skilled in the art, without paying any creative work, other drawings can be obtained based on these drawings.

DETAILED DESCRIPTION OF PREFERRED EMBODIMENTS

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

The transistors used in all embodiments of this application can be thin film transistors or field effect transistors or other devices with the same characteristics. Since the source and drain of the transistors used here are symmetrical, the source and drain can be interchanged. In the embodiments of the present application, in order to distinguish the two poles of the transistor other than the gate, one of the poles is called the source and the other is called the drain. According to the form in the figure, it is stipulated that the middle end of the transistor is the gate, the signal input end is the source, and the output end is the drain. In addition, the transistors used in the embodiments of the present application are N-type transistors or P-type transistors, where the N-type transistor is turned on when the gate is at a high level and turned off when the gate is at a low level; and the P-type transistor is low-voltage on the gate. It is usually turned on and turned off when the gate is at a high level.

It should be noted that the GOA circuit provided in the embodiment of the present application can be used to implement forward scanning or reverse scanning. Among them, the forward scanning means that the GOA circuit starts sequentially from the first-level GOA unit to the last-level GOA unit; the reverse scanning means that the GOA unit starts sequentially from the last-level GOA unit to the first-level GOA unit.

Figure 1:
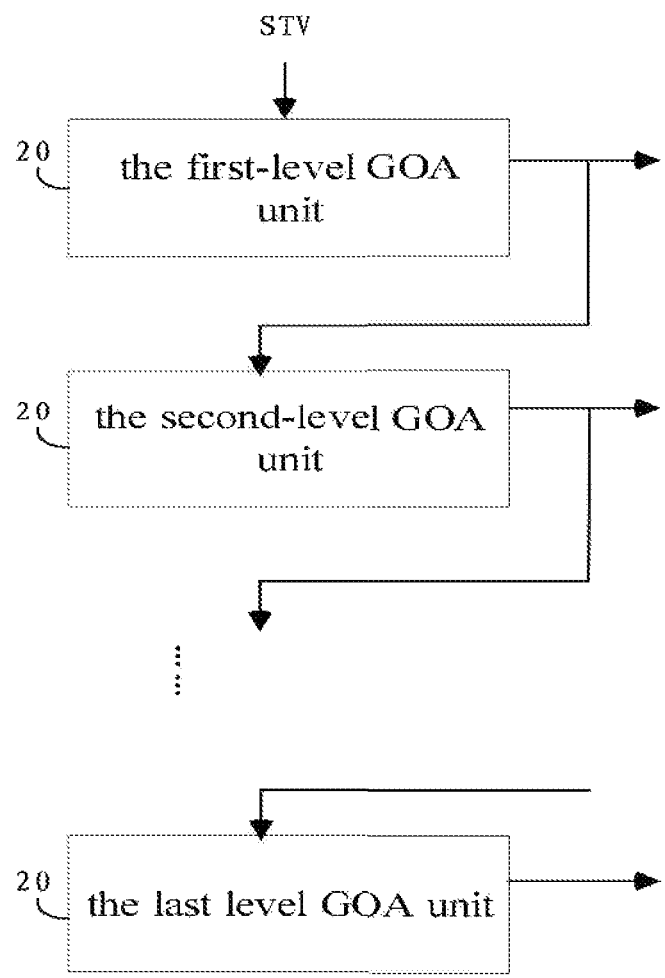
FIG. 1 is a schematic structural diagram of a GOA circuit provided by an embodiment of the application.

In the following, the embodiment of the present application will take the forward scanning as an example for description. Please refer to FIG. 1. FIG. 1 is a schematic structural diagram of a GOA circuit provided by an embodiment of the application. As shown in FIG. 1, the GOA circuit 10 provided by the embodiment of the present application comprises multi-level cascaded GOA units 20. Each level of the GOA units 20 is configured to output a scan signal. Wherein, when the GOA circuit 10 is working, the upper-level scan signal accessed by the first-level GOA unit 20 is the preset start signal STV; subsequently, the second-level GOA unit 20 and the third-level GOA unit 20 , . . . , the last level GOA unit 20 is sequentially started.

Figure 2:
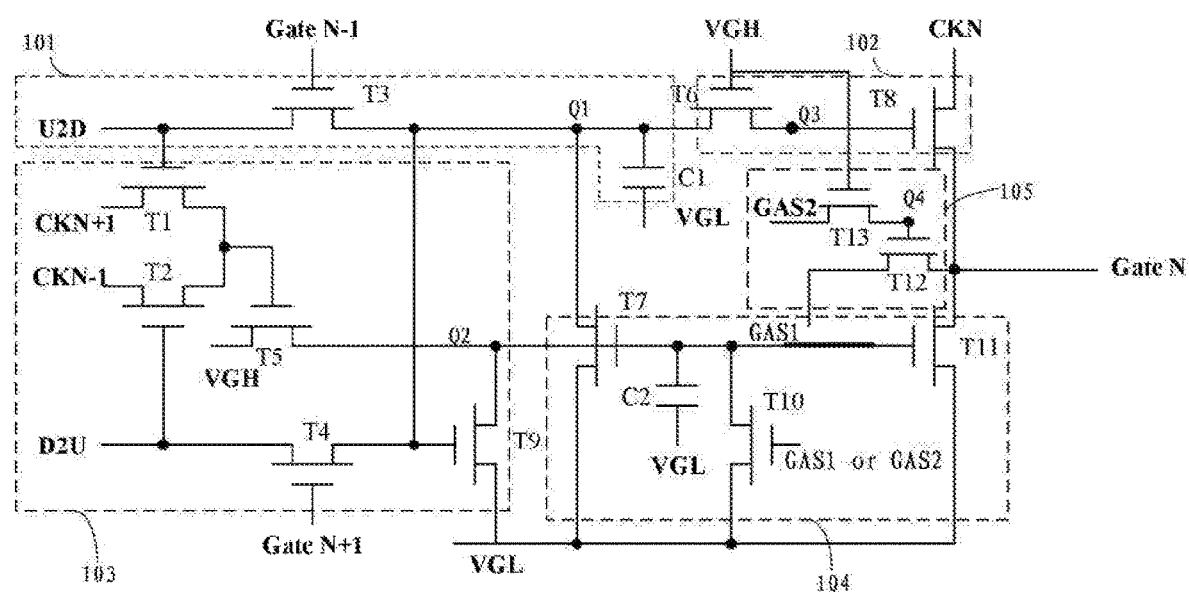
FIG. 2 is a schematic circuit diagram of any one of GOA units in FIG. 1.

Please refer to FIG. 2. FIG. 2 is a schematic circuit diagram of any one of the GOA units in FIG. 1. As shown in FIG. 2, each level of the GOA units comprises a pull-up control module 101, a pull-up module 102, a pull-down module 103, a pull-down holding module 104, and a reset module 105.

Wherein the pull-up control module 101 is connected to an upper-level scan signal Gate N-1, a first scan control signal U2D, and a low-level signal VGL, and is electrically connected to a first node Q1. The pull-up control module 101 is configured to output the first scan control signal U2D to the first node Q1 according to the upper-level scan signal Gate N-1, the low-level signal VGL, and the first scan control signal U2D.

Wherein the pull-up module 102 is connected to a high-level signal VGH and a clock signal CKN of a current level, and is electrically connected to a scan signal output end of the current level and the first node Q1. The pull-up module 101 is configured to output a scan signal Gate N of the current level at the scan signal output end according to the high level signal VGH, the clock signal CKN of the current level and a potential of the first node Q1.

Wherein the pull-down module 103 is connected to a next-level clock signal CKN+1, an upper-level clock signal CKN-1, a second scan control signal D2U, a next-level scan signal Gate N+1, the low-level signal VGL, and the high-level signal VGH, and is electrically connected to the first node Q1 and the second node Q2. The pull-down module 103 is configured to pull down a potential of the first node Q1 and pull up a potential of the second node Q2 according to the next-level clock signal CKN+1, the upper-level clock signal CKN-1, the second scan control signal D2U, the next-level scan signal Gate N+1, the low-level signal VGL, and the high-level signal VGH.

Wherein the pull-down holding module 104 is connected to a pull-down holding control signal and the low-level signal VGL, and is electrically connected to the first node Q1, the second node Q2, and the scan signal output end of the current level. The pull-down holding module 104 is configured to hold the potential of the first node Q1 and the potential of the scan signal output end of the current level according to the pull-down holding control signal, the low-level signal VGL, and the potential of the second node Q2.

Wherein the reset module 105 is connected to a first function control signal GAS1, a second function control signal GAS2, and the high-level signal VGH, and is electrically connected to the scan signal output end of the current level. The reset module 105 is configured to reset the potential of the scan signal output end according to the first function control signal GAS1, the second function control signal GAS2, and the high level signal VGH.

It should be noted that the specific circuit structures of the pull-up control module 101, the pull-up module 102, the pull-down module 103, and the pull-down holding module 104 in the embodiment of the present application do not only comprise the circuit structure described below. Based on the functional description of the above modules in the technical solution of the application, the skilled person can obtain a variety of circuit structures that can achieve the same function.

In some embodiments, the pull-up control module 101 comprises a third transistor T3 and a first capacitor C1. A gate of the third transistor T3 is electrically connected to the upper-level scan Gate N-1, a source of the third transistor T3 is electrically connected to the first scan control signal U2D, and a drain of the third transistor T3 is electrically connected to the first node Q1. One end of the first capacitor C1 is electrically connected to the first node Q1, and another end of the first capacitor C1 is electrically connected to the low-level signal VGL.

In some embodiments, the pull-up module 102 comprises a sixth transistor T6 and an eighth transistor T8. A gate of the sixth transistor T6 is electrically connected to the high-level signal VGH, a source of the sixth transistor T6 is electrically connected to the first node Q1, and a drain of the sixth transistor T6 is electrically connected to a third node Q3. A gate of the eighth transistor T8 is electrically connected to the third node Q3, a source of the eighth transistor T8 is electrically connected to the clock signal CKN of the current level, and a drain of the eighth transistor T8 is electrically connected to scan signal output end of the current level.

In some embodiments, the pull-down module 103 comprises a first transistor T1, a second transistor T2, a fourth transistor T4, a fifth transistor T5, and a ninth transistor T9. A gate of the first transistor T1 is electrically connected to the first scan control signal U2D, and a source of the first transistor T1 is electrically connected to the next-level clock signal CKN+1. A gate of the second transistor T2 is electrically connected to the second scan control signal D2U, and a source of the second transistor T2 is electrically connected to the upper-level clock signal CKN−1. A drain of the first transistor T1, a drain of the second transistor T2 and a gate of the fifth transistor T5 are electrically connected, and a source of the fifth transistor T5 is electrically connected to the high-level signal VGH, and a drain of the fifth transistor T5 is electrically connected to the second node Q2. A gate of the fourth transistor T4 is electrically connected to the next-level scan signal Gate N+1, a source of the fourth transistor T4 is electrically connected to the second scan control signal D2U, and a drain of the fourth transistor T4 is electrically connected to the first node Q1. A gate of the ninth transistor T9 is electrically connected to the first node Q1, a source of the ninth transistor T9 is electrically connected to the low-level signal VGL, and a drain of the ninth transistor T9 is electrically connected to the second node Q2.

In some embodiments, the pull-down holding module 104 comprises a seventh transistor T7, a tenth transistor T10, an eleventh transistor T11, and a second capacitor C2. A gate of the seventh transistor T7 is electrically connected to the second node Q2, a source of the seventh transistor T7 is electrically connected to the low-level signal VGL, and a drain of the seventh transistor T7 is electrically connected to the first node Q1. A gate of the tenth transistor T10 is electrically connected to the first function control signal GAS1 or the second function control signal GAS2, a source of the tenth transistor T10 is electrically connected to the low-level signal VGL, and a drain of the tenth transistor T10 is electrically connected to the second node Q2. A gate of the eleventh transistor T11 is electrically connected to the second node Q2, a source of the tenth transistor T10 is electrically connected to the low-level signal VGL, and a drain wire of the tenth transistor T10 is connected to the scan signal output end of the current level.

In some embodiments, the reset module 105 comprises a twelfth transistor T12 and a thirteenth transistor T13. A gate of the twelfth transistor T12 is electrically connected to a fourth node Q4, a source of the twelfth transistor T12 is electrically connected to the first function control signal GAS1, and a drain of the twelfth transistor T12 is electrically connected to the scan signal output end of the current level. A gate of the thirteenth transistor T13 is electrically connected to the high-level signal VGH, a source of the thirteenth transistor T13 is electrically connected to the second function control signal GAS2, and a drain of the thirteenth transistor T13 is electrically connected to the fourth node Q4.

The working principle of the GOA circuit provided by the embodiment of the present application will be described below in conjunction with FIG. 2 and FIG. 3. Among them, FIG. 3 is a signal timing diagram of the GOA unit shown in FIG. 2.

In the embodiment of the present application, the first scan control signal U2D and the second scan control signal D2U are signals with opposite phases, and the potential of the first scan control signal U2D is high, and the potential of the second scan control signal D2U is low.

In the embodiment of the present application, the pull-down holding control signal is the same signal as the first function control signal GAS1 or the second function control signal GAS2. That is, the embodiment of the present application multiplexes the first function control signal GAS1 or the second function control signal GAS2 as the pull-down holding control signal, thereby reducing signal settings and providing more wiring space for the display panel.

Figure 3:
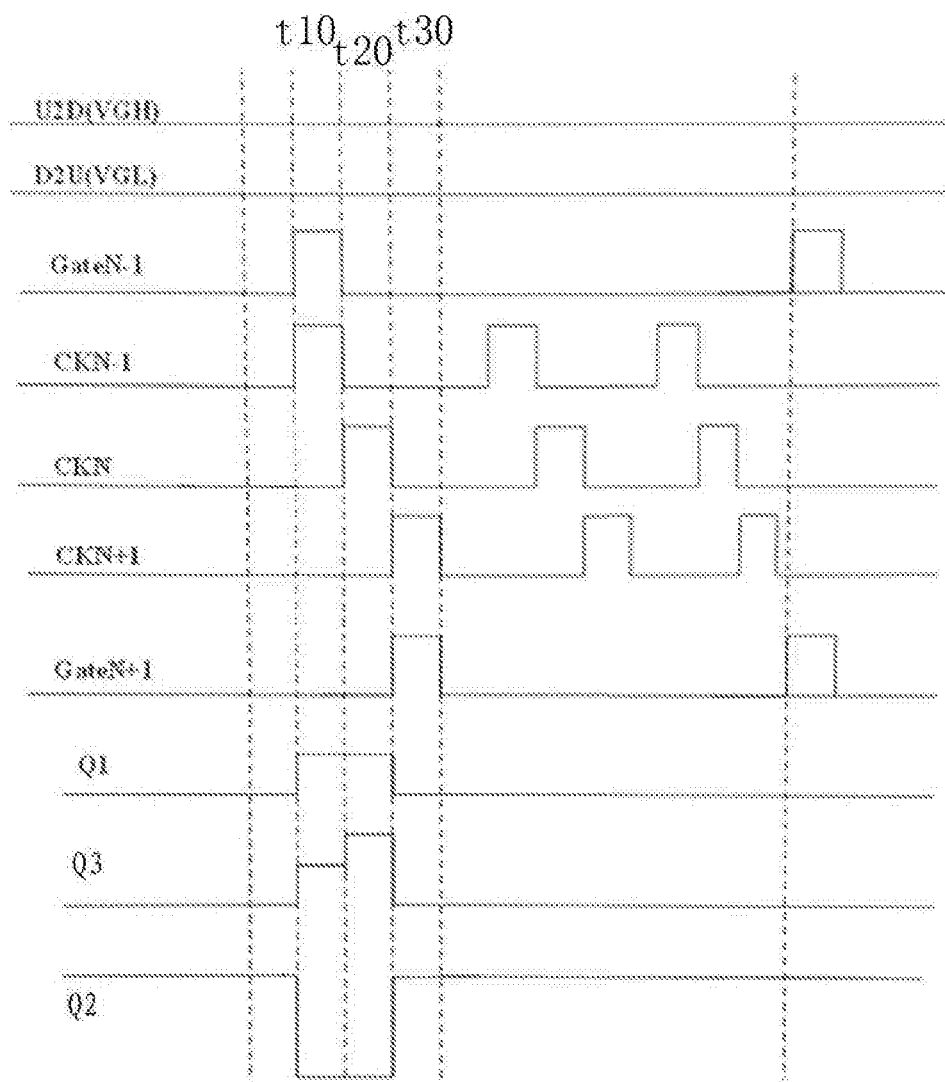
FIG. 3 is a signal timing diagram of the GOA unit shown in FIG. 2.

Please refer to FIG. 2 and FIG. 3. First, at the time t10, when the upper-level scan signal Gate N-1 is at a high potential, the third transistor T3 is turned on, and the first scan control signal U2D is output to the first node Q1 through the third transistor T3, so that the potential of the first node Q1 is high at this time. Since the sixth transistor T6 is in the normally-on state, the potential of the third node Q3 at this time is also high. In addition, the potentials of the first node Q1 and the second node Q2 are stored by the first capacitor C1. At the same time, when the upper-level scan signal Gate N-1 is at a high level, the first transistor T1 is also turned on. Because the clock signal CKN+1 of the next level is at a low level at this time, the fifth transistor T5 is turned off, thereby making the potential of the second node Q2 low.

Subsequently, at the time t20, the potential of the upper-level scan signal Gate N-1 is low, the third transistor T3 is turned off, and the potential of the first node Q1 holds the potential at the time t1. At the same time, the potential of the clock signal CKN of a current level changes from low to high. Due to the coupling effect of the parasitic capacitance of the eighth transistor T8, the potential of the third node Q3 jumps instantaneously, so that the potential of the third node Q3 reaches a higher level. At this time, the eighth transistor T8 is turned on, and the scanning signal G(n) of the current level and the transmission signal ST(n) of the current level are high. At this time, the potential of the second node Q2 is still low. That is, when the eighth transistor T8 is turned on, the potential of the third node Q3 is greater than the potential of the first node Q1.

Finally, at the time t30, the potential of the next-level scan signal Gate N+1 is high, the fourth transistor T4 is turned on, and the second scan control signal D2U is output to the first node Q1 through the fourth transistor T4, and then pulls down the potential of the first node Q1. At the same time, the next-stage clock signal CKN+1 is at a high potential, so that the fifth transistor T5 is turned on, and the high-level signal VGH is output to the second node Q2 through the fifth transistor T5, so that the potential of the second node Q2 is high. Further, at this time, the seventh transistor T7 and the eleventh transistor T11 are both turned on, and the low-level signal VGL is output to the first node Q1 and the scan signal output end of the current level through the seventh transistor T7 and the eleventh transistor T11 respectively. As a result, the potential of the first node Q1 and the potential of the scan signal Gate N of the current level are both low.

In particular, in the embodiment of the present application, a reset module 105 is provided in each level of the GOA units, so that each level of the GOA units can output a high potential before the end of a frame, and all gates in the display area are turned on, the charge of all pixels in the display area is discharged; after that, each level of the GOA units outputs a low potential, and all gates in the display area are set to low potential.

Figure 4:
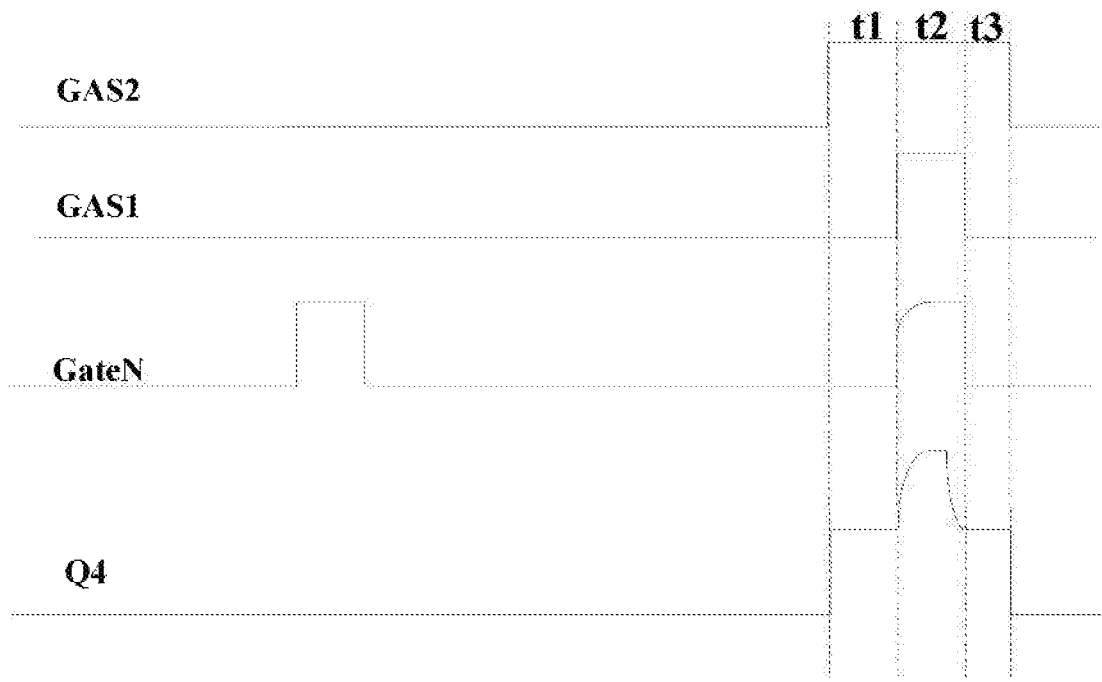
FIG. 4 is a schematic diagram of a reset sequence of the GOA circuit provided by an embodiment of the application.

Specifically, the description will be given below with reference to FIGS. 2 and 4. Wherein, FIG. 4 is a schematic diagram of the reset sequence of the GOA circuit provided by an embodiment of the application. As shown in FIG. 2 and FIG. 4, before the end of a frame, first, at the time t1, the potential of the second scan control signal D2U is high, and at this time the thirteenth transistor T13 is turned on, and the second scan control signal D2U is output to the fourth node Q4 through the twelfth transistor T12 to precharge the fourth node Q4; then, at the time t2, the potentials of the second function control signal GAS2 and the first function control signal GAS1 are both high (the second function control The potential of the signal GAS2 can also be low at t2, which can be adjusted according to actual needs). Since the fourth node Q4 is subject to the bootstrap effect, its potential will be pulled to approximately twice the amplitude of the first function control signal, and the output waveform is also better. That is, when the twelfth transistor T12 is turned on, the potential of the fourth node Q4 is greater than the potential of the second function control signal GAS2. Finally, at the time t3, the potential of the first function control signal GAS1 is low, and the potential of the second function control signal GAS2 is high, so that the current level scan signal Gate N output from the current level scan signal output terminal is pulled low and reset.

Figure 5:
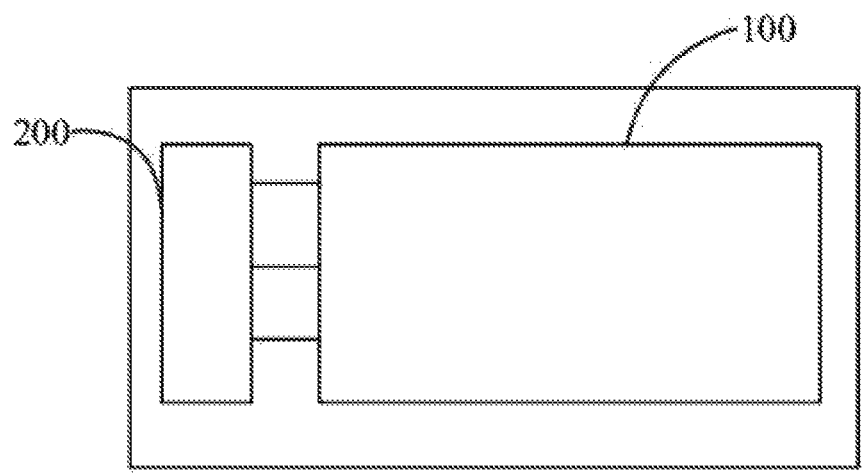
FIG. 5 is a schematic structural diagram of a display panel provided by an embodiment of the application.

Please refer to FIG. 5. FIG. 5 is a schematic structural diagram of a display panel provided by an embodiment of the application. As shown in FIG. 5, the display panel comprises a display area 100 and a GOA circuit 200 integratedly arranged on the edge of the display area 100; wherein the structure and principle of the GOA circuit 200 are similar to the GOA circuit 10 described above, and will not be repeated here.

The above are only the embodiments of the present invention and do not limit the scope of the present invention. Any equivalent structure or equivalent process transformation made by using the contents of the description and drawings of the present invention, or directly or indirectly applied to other related technical fields, The same reason is comprised in the scope of patent protection of the present invention.

What is claimed is:

1. A gate driver on array (GOA) circuit, comprising multi-level cascaded GOA units, wherein each level of the GOA units comprises a pull-up control module, a pull-up module, a pull-down module, a pull-down holding module, and a reset module;

wherein the pull-up control module is connected to an upper-level scan signal, a first scan control signal, and a low-level signal, and is electrically connected to a first node; and the pull-up control module is configured to output the first scan control signal to the first node according to the upper-level scan signal, the low-level signal, and the first scan control signal;

wherein the pull-up module is connected to a high-level signal and a clock signal of a current level, and is electrically connected to a scan signal output end of the current level and the first node; and the pull-up module is configured to output a scan signal of the current level at the scan signal output end according to the high level signal, the clock signal of the current level, and a potential of the first node;

wherein the pull-down module is connected to a next-level clock signal, an upper-level clock signal, a second scan control signal, a next-level scan signal, the low-level signal, and the high-level signal, and is electrically connected to the first node and a second node; and the pull-down module is configured to pull down the potential of the first node and pull up a potential of the second node according to the next-level clock signal, the upper-level clock signal, the second scan control signal, the next-level scan signal, the low-level signal, and the high-level signal;

wherein the pull-down holding module is connected to a pull-down holding control signal and the low-level signal, and is electrically connected to the first node, the second node, and the scan signal output end of the current level; and the pull-down holding module is configured to hold the potential of the first node and a potential of the scan signal output end of the current level according to the pull-down holding control signal, the low-level signal, and the potential of the second node;

wherein the reset module is connected to a first function control signal, a second function control signal, and the high-level signal, and is electrically connected to the scan signal output end of the current level; and the reset module is configured to reset the potential of the scan signal output end according to the first function control signal, the second function control signal, and the high level signal;

wherein the reset module comprises a twelfth transistor and a thirteenth transistor;

a gate of the twelfth transistor is electrically connected to a fourth node, a source of the twelfth transistor is electrically connected to the first function control signal, and a drain of the twelfth transistor is electrically connected to the scan signal output end of the current level;

a gate of the thirteenth transistor is electrically connected to the high-level signal, a source of the thirteenth transistor is electrically connected to the second function control signal, and a drain of the thirteenth transistor is electrically connected to the fourth node; and the pull-down holding control signal is the same signal as the first function control signal or the second function control signal.

2. The GOA circuit of claim 1, wherein the pull-up control module comprises a third transistor and a first capacitor;

a gate of the third transistor is electrically connected to the upper-level scan signal, a source of the third transistor is electrically connected to the first scan control signal, and a drain of the third transistor is electrically connected to the first node; and one end of the first capacitor is electrically connected to the first node, and another end of the first capacitor is electrically connected to the low-level signal.

3. The GOA circuit of claim 1, wherein the pull-up module comprises a sixth transistor and an eighth transistor;

a gate of the sixth transistor is electrically connected to the high-level signal, a source of the sixth transistor is electrically connected to the first node, and a drain of the sixth transistor is electrically connected to a third node;

a gate of the eighth transistor is electrically connected to the third node, a source of the eighth transistor is electrically connected to the clock signal of the current level, and a drain of the eighth transistor is electrically connected to the scan signal output end of the current level.

4. The GOA circuit of claim 3, wherein when the eighth transistor is turned on, a potential of the third node is greater than the potential of the first node.

5. The GOA circuit of claim 1, wherein the pull-down module comprises a first transistor, a second transistor, a fourth transistor, a fifth transistor, and a ninth transistor;
a gate of the first transistor is electrically connected to the first scan control signal, and a source of the first transistor is electrically connected to the next-level clock signal;
a gate of the second transistor is electrically connected to the second scan control signal, and a source of the second transistor is electrically connected to the upper-level clock signal;
a drain of the first transistor, a drain of the second transistor, and a gate of the fifth transistor are electrically connected, a source of the fifth transistor is electrically connected to the high-level signal, and a drain of the fifth transistor is electrically connected to the second node;
a gate of the fourth transistor is electrically connected to the next-level scan signal, a source of the fourth transistor is electrically connected to the second scan control signal, and a drain of the fourth transistor is electrically connected to the first node; and
a gate of the ninth transistor is electrically connected to the first node, a source of the ninth transistor is electrically connected to the low-level signal, and a drain of the ninth transistor is electrically connected to the second node.

6. The GOA circuit of claim 1, wherein the pull-down holding module comprises a seventh transistor, a tenth transistor, an eleventh transistor, and a second capacitor;
a gate of the seventh transistor is electrically connected to the second node, a source of the seventh transistor is electrically connected to the low-level signal, and a drain of the seventh transistor is electrically connected to the first node;
a gate of the tenth transistor is electrically connected to the first function control signal or the second function control signal, a source of the tenth transistor is electrically connected to the low-level signal, and a drain of the tenth transistor is electrically connected to the second node; and
a gate of the eleventh transistor is electrically connected to the second node, a source of the tenth transistor is electrically connected to the low-level signal, and a drain of the tenth transistor is electrically connected to the scan signal output end of the current level.

7. The GOA circuit of claim 1, wherein when the twelfth transistor is turned on, a potential of the fourth node is greater than a potential of the second function control signal.

8. A gate driver on array (GOA) circuit, comprising multi-level cascaded GOA units, wherein each level of the GOA units comprises a pull-up control module, a pull-up module, a pull-down module, a pull-down holding module, and a reset module;
the pull-up control module is connected to an upper-level scan signal, a first scan control signal, and a low-level signal, and is electrically connected to a first node; and the pull-up control module is configured to output the first scan control signal to the first node according to the upper-level scan signal, the low-level signal, and the first scan control signal;
the pull-up module is connected to a high-level signal and a clock signal of a current level, and is electrically connected to a scan signal output end of the current level and the first node; and the pull-up module is configured to output a scan signal of the current level at the scan signal output end according to the high level signal, the clock signal of the current level, and a potential of the first node;
the pull-down module is connected to a next-level clock signal, an upper-level clock signal, a second scan control signal, a next-level scan signal, the low-level signal, and the high-level signal, and is electrically connected to the first node and a second node; and the pull-down module is configured to pull down the potential of the first node and pull up a potential of the second node according to the next-level clock signal, the upper-level clock signal, the second scan control signal, the next-level scan signal, the low-level signal, and the high-level signal;
the pull-down holding module is connected to a pull-down holding control signal and the low-level signal, and is electrically connected to the first node, the second node, and the scan signal output end of the current level; and the pull-down holding module is configured to hold the potential of the first node and a potential of the scan signal output end of the current level according to the pull-down holding control signal, the low-level signal, and the potential of the second node; and
the reset module is connected to a first function control signal, a second function control signal, and the high-level signal, and is electrically connected to the scan signal output end of the current level; and the reset module is configured to reset the potential of the scan signal output end according to the first function control signal, the second function control signal, and the high level signal.

9. The GOA circuit of claim 8, wherein the pull-up control module comprises a third transistor and a first capacitor;
a gate of the third transistor is electrically connected to the upper-level scan signal, a source of the third transistor is electrically connected to the first scan control signal, and a drain of the third transistor is electrically connected to the first node; and
one end of the first capacitor is electrically connected to the first node, and another end of the first capacitor is electrically connected to the low-level signal.

10. The GOA circuit of claim 8, wherein the pull-up module comprises a sixth transistor and an eighth transistor;
a gate of the sixth transistor is electrically connected to the high-level signal, a source of the sixth transistor is electrically connected to the first node, and a drain of the sixth transistor is electrically connected to a third node;
a gate of the eighth transistor is electrically connected to the third node, a source of the eighth transistor is electrically connected to the clock signal of the current level, and a drain of the eighth transistor is electrically connected to the scan signal output end of the current level.

11. The GOA circuit of claim 10, wherein when the eighth transistor is turned on, a potential of the third node is greater than the potential of the first node.

12. The GOA circuit of claim 8, wherein the pull-down module comprises a first transistor, a second transistor, a fourth transistor, a fifth transistor, and a ninth transistor;

a gate of the first transistor is electrically connected to the first scan control signal, and a source of the first transistor is electrically connected to the next-level clock signal;

a gate of the second transistor is electrically connected to the second scan control signal, and a source of the second transistor is electrically connected to the upper-level clock signal;

a drain of the first transistor, a drain of the second transistor, and a gate of the fifth transistor are electrically connected, a source of the fifth transistor is electrically connected to the high-level signal, and a drain of the fifth transistor is electrically connected to the second node;

a gate of the fourth transistor is electrically connected to the next-level scan signal, a source of the fourth transistor is electrically connected to the second scan control signal, and a drain of the fourth transistor is electrically connected to the first node; and a gate of the ninth transistor is electrically connected to the first node, a source of the ninth transistor is electrically connected to the low-level signal, and a drain of the ninth transistor is electrically connected to the second node.

13. The GOA circuit of claim 8, wherein the pull-down holding module comprises a seventh transistor, a tenth transistor, an eleventh transistor, and a second capacitor;

a gate of the seventh transistor is electrically connected to the second node, a source of the seventh transistor is electrically connected to the low-level signal, and a drain of the seventh transistor is electrically connected to the first node;

a gate of the tenth transistor is electrically connected to the first function control signal or the second function control signal, a source of the tenth transistor is electrically connected to the low-level signal, and a drain of the tenth transistor is electrically connected to the second node; and a gate of the eleventh transistor is electrically connected to the second node, a source of the tenth transistor is electrically connected to the low-level signal, and a drain of the tenth transistor is electrically connected to the scan signal output end of the current level.

14. The GOA circuit of claim 8, wherein the reset module comprises a twelfth transistor and a thirteenth transistor;

a gate of the twelfth transistor is electrically connected to a fourth node, a source of the twelfth transistor is electrically connected to the first function control signal, and a drain of the twelfth transistor is electrically connected to the scan signal output end of the current level; and a gate of the thirteenth transistor is electrically connected to the high-level signal, a source of the thirteenth transistor is electrically connected to the second function control signal, and a drain of the thirteenth transistor is electrically connected to the fourth node.

15. The GOA circuit of claim 14, wherein when the twelfth transistor is turned on, a potential of the fourth node is greater than a potential of the second function control signal.

16. The GOA circuit of claim 8, wherein the pull-down holding control signal is the same signal as the first function control signal or the second function control signal.

17. A display panel, comprising a gate driver on array (GOA) circuit, wherein the GOA circuit comprises multi-level cascaded GOA units, each level of the GOA units comprises a pull-up control module, a pull-up module, a pull-down module, a pull-down holding module, and a reset module;

the pull-up control module is connected to an upper-level scan signal, a first scan control signal, and a low-level signal, and is electrically connected to a first node; and the pull-up control module is configured to output the first scan control signal to the first node according to the upper-level scan signal, the low-level signal, and the first scan control signal;

the pull-up module is connected to a high-level signal and a clock signal of a current level, and is electrically connected to a scan signal output end of the current level and the first node; and the pull-up module is configured to output a scan signal of the current level at the scan signal output end according to the high level signal, the clock signal of the current level, and a potential of the first node;

the pull-down module is connected to a next-level clock signal, an upper-level clock signal, a second scan control signal, a next-level scan signal, the low-level signal, and the high-level signal, and is electrically connected to the first node and a second node; and the pull-down module is configured to pull down the potential of the first node and pull up a potential of the second node according to the next-level clock signal, the upper-level clock signal, the second scan control signal, the next-level scan signal, the low-level signal, and the high-level signal;

the pull-down holding module is connected to a pull-down holding control signal and the low-level signal, and is electrically connected to the first node, the second node, and the scan signal output end of the current level; and the pull-down holding module is configured to hold the potential of the first node and a potential of the scan signal output end of the current level according to the pull-down holding control signal, the low-level signal, and the potential of the second node; and the reset module is connected to a first function control signal, a second function control signal, and the high-level signal, and is electrically connected to the scan signal output end of the current level; and the reset module is configured to reset the potential of the scan signal output end according to the first function control signal, the second function control signal, and the high level signal.

18. The display panel of claim 17, wherein the pull-up control module comprises a third transistor and a first capacitor;

a gate of the third transistor is electrically connected to the upper-level scan signal, a source of the third transistor is electrically connected to the first scan control signal, and a drain of the third transistor is electrically connected to the first node; and one end of the first capacitor is electrically connected to the first node, and another end of the first capacitor is electrically connected to the low-level signal.

19. The display panel of claim 17, wherein the pull-up module comprises a sixth transistor and an eighth transistor;

a gate of the sixth transistor is electrically connected to the high-level signal, a source of the sixth transistor is electrically connected to the first node, and a drain of the sixth transistor is electrically connected to a third node; and a gate of the eighth transistor is electrically connected to the third node, a source of the eighth transistor is electrically connected to the clock signal of the current level, and a drain of the eighth transistor is electrically connected to scan signal output end of the current level.

20. The display panel of claim 19, wherein when the eighth transistor is turned on, a potential of the third node is greater than the potential of the first node.

* * * * *